(12) United States Patent
Hiramatsu et al.

(10) Patent No.: US 11,211,529 B2
(45) Date of Patent: Dec. 28, 2021

(54) SEMICONDUCTOR LIGHT-EMITTING ELEMENT AND METHOD FOR MANUFACTURING SAME

(71) Applicants: TOSHIBA MATERIALS CO., LTD., Yokohama (JP); Meijo University, Nagoya (JP)

(72) Inventors: Ryosuke Hiramatsu, Kanagawa (JP); Atsuya Sasaki, Kanagawa (JP); Hideaki Hirabayashi, Kanagawa (JP); Satoshi Kamiyama, Aichi (JP)

(73) Assignees: TOSHIBA MATERIALS CO., LTD., Yokohama (JP); MEIJO UNIVERSITY, Nagoya (JP)

( * ) Notice: Subject to any disclaimer, the term of this patent is extended or adjusted under 35 U.S.C. 154(b) by 32 days.

(21) Appl. No.: 16/782,743

(22) Filed: Feb. 5, 2020

(65) Prior Publication Data

US 2020/0176633 A1     Jun. 4, 2020

Related U.S. Application Data

(63) Continuation of application No. PCT/JP2018/025731, filed on Jul. 6, 2018.

(30) Foreign Application Priority Data

Aug. 31, 2017  (JP) .............................. JP2017-167131

(51) Int. Cl.
*H01L 21/00*  (2006.01)
*H01L 33/32*  (2010.01)
(Continued)

(52) U.S. Cl.
CPC .......... *H01L 33/32* (2013.01); *H01L 33/0075* (2013.01); *H01L 33/04* (2013.01); *H01L 2933/0033* (2013.01)

(58) Field of Classification Search
CPC combination set(s) only.
See application file for complete search history.

(56) References Cited

U.S. PATENT DOCUMENTS

2003/0042496 A1* 3/2003 Sasaoka ............ H01L 21/30612
257/102
2009/0289270 A1* 11/2009 Hanawa ................ C30B 25/183
257/98
(Continued)

FOREIGN PATENT DOCUMENTS

JP      2016-518697 A      6/2016

*Primary Examiner* — Ali Naraghi
(74) *Attorney, Agent, or Firm* — Foley & Lardner LLP (57) ABSTRACT

A semiconductor light-emitting element according to an embodiment has a light emission peak wavelength not less than 380 nm and not more than 425 nm. The semiconductor light-emitting element includes a stacked structure including a reflective layer, a substrate provided on the reflective layer, and a semiconductor layer provided on the substrate. An uneven structure is provided in a surface of the substrate on the semiconductor layer side. The semiconductor layer includes a buffer layer made of aluminum nitride and having a thickness not less than 10 nm and not more than 100 nm. The buffer layer includes oxygen; and $0.01 \leq O_{8nm}/O_{3nm} \leq 0.5$ is satisfied, where $O_{3nm}$ (at %) is the oxygen concentration at a depth of 3 nm of the buffer layer, and $O_{8nm}$ (at %) is the oxygen concentration at a depth of 8 nm of the buffer layer.

16 Claims, 2 Drawing Sheets

(51) Int. Cl.
*H01L 33/00* (2010.01)
*H01L 33/04* (2010.01)

(56) References Cited

U.S. PATENT DOCUMENTS

| | | | |
|---|---|---|---|
| 2014/0264363 A1* | 9/2014 | Zhu | H01J 37/347 |
| | | | 257/76 |
| 2015/0214439 A1* | 7/2015 | Herner | H01L 33/0095 |
| | | | 257/13 |
| 2015/0280055 A1* | 10/2015 | Michiue | H01L 21/0254 |
| | | | 438/497 |
| 2018/0158981 A1* | 6/2018 | Park | H01L 33/22 |
| 2019/0067512 A1* | 2/2019 | Okuno | H01L 33/007 |
| 2019/0081208 A1* | 3/2019 | Choi | H01L 33/62 |
| 2019/0296189 A1* | 9/2019 | Lin | H01L 33/32 |

* cited by examiner

SEMICONDUCTOR LIGHT-EMITTING ELEMENT AND METHOD FOR MANUFACTURING SAME

CROSS-REFERENCE TO RELATED APPLICATIONS

This is a continuation application of International Application PCT/JP2018/025731, filed on Jul. 6, 2018. This application also claims the benefit of priority from Japanese Patent Application No. 2017-167131, filed on Aug. 31, 2017. The entire contents of each are incorporated herein by reference.

FIELD

An embodiment described below relates to a semiconductor light-emitting element and a method for manufacturing the same.

BACKGROUND

Development is being pursued actively for semiconductor light-emitting elements such as light-emitting diodes (LEDs), etc., as new light sources from the perspective of environmental problems and/or energy conservation. Gallium nitride-based semiconductors such as GaN, InGaN, AlGaN, InAlGaN, etc., are drawing attention as semiconductors used in such a semiconductor light-emitting element. Also, the development of a semiconductor light-emitting element using a gallium nitride semiconductor is being advanced to increase the light emission intensity and/or the luminous efficiency and improve characteristics such as a longer life, etc. For example, Patent Literature 1 discusses forming a semiconductor layer on an AlN buffering buffer layer having a uniform oxygen concentration distribution to improve the crystal quality of the gallium nitride semiconductor layer.

On the other hand, to realize more natural white, a semiconductor light-emitting element that emits bluish-violet light is drawing attention. The light emission peak wavelength of the semiconductor light-emitting element is not less than 380 nm and not more than 425 nm; and the light emission peak wavelength is short compared to that of a conventional semiconductor light-emitting element emitting blue light. The development of technology is still insufficient for a semiconductor light-emitting element having a light emission peak wavelength not less than 380 nm and not more than 425 nm in which the characteristics such as the light emission intensity, etc., can be improved compared to a conventional semiconductor light-emitting element. Therefore, it is desirable to develop technology for a semiconductor light-emitting element having a light emission peak wavelength not less than 380 nm and not more than 425 nm in which the characteristics such as the light emission intensity, etc., can be improved.

DETAILED DESCRIPTION

A semiconductor light-emitting element according to an embodiment has a light emission peak wavelength not less than 380 nm and not more than 425 nm. The semiconductor light-emitting element includes a stacked structure including a reflective layer, a substrate provided on the reflective layer, and a semiconductor layer provided on the substrate. An uneven structure is provided in a surface of the substrate on the semiconductor layer side. The semiconductor layer includes a buffer layer made of aluminum nitride and having a thickness not less than 10 nm and not more than 100 nm. The buffer layer includes oxygen; and $0.01 \leq O_{8nm}/O_{3nm} \leq 0.5$ is satisfied, where $O_{3nm}$ (at %) is the oxygen concentration at a depth of 3 nm of the buffer layer, and $O_{8nm}$ (at %) is the oxygen concentration at a depth of 8 nm of the buffer layer.

Various embodiments are described below with reference to the accompanying drawings.

The drawings are schematic and conceptual; and the relationships between the thicknesses and widths of portions, the proportions of sizes among portions, etc., are not necessarily the same as the actual values. Also, the dimensions and/or the proportions may be illustrated differently among drawings, even when the same portion is illustrated. In the specification and drawings, components similar to those described previously are marked with the same reference numerals; and a detailed description is omitted as appropriate.

Although embodiments are described using the directions of up and down in the description hereinbelow, these directions are relative and are not limited to vertical directions. Also, in the specification, a stacked structure of an A layer and a B layer is represented A/B; and this means that the A layer is provided on the B layer.

Figure 1:
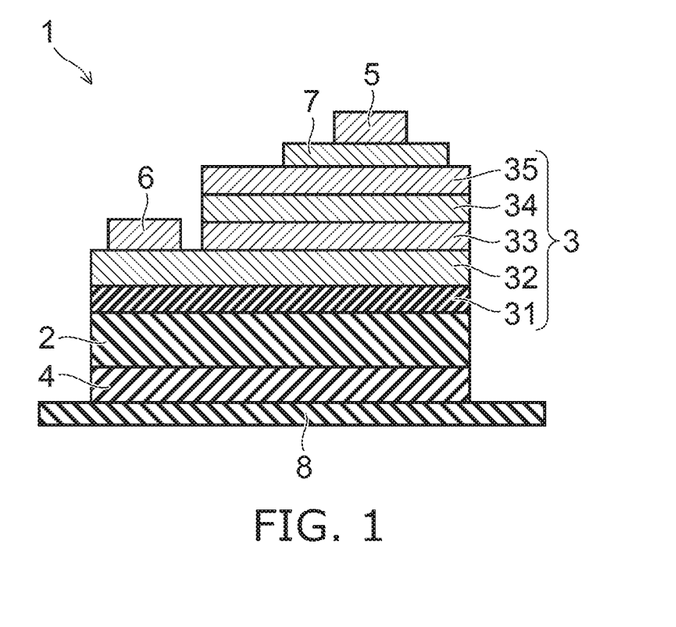
FIG. 1 is a cross-sectional view schematically illustrating a semiconductor light-emitting element according to an embodiment.

FIG. 1 is a cross-sectional view schematically illustrating a semiconductor light-emitting element 1 according to an embodiment.

Figure 2A:
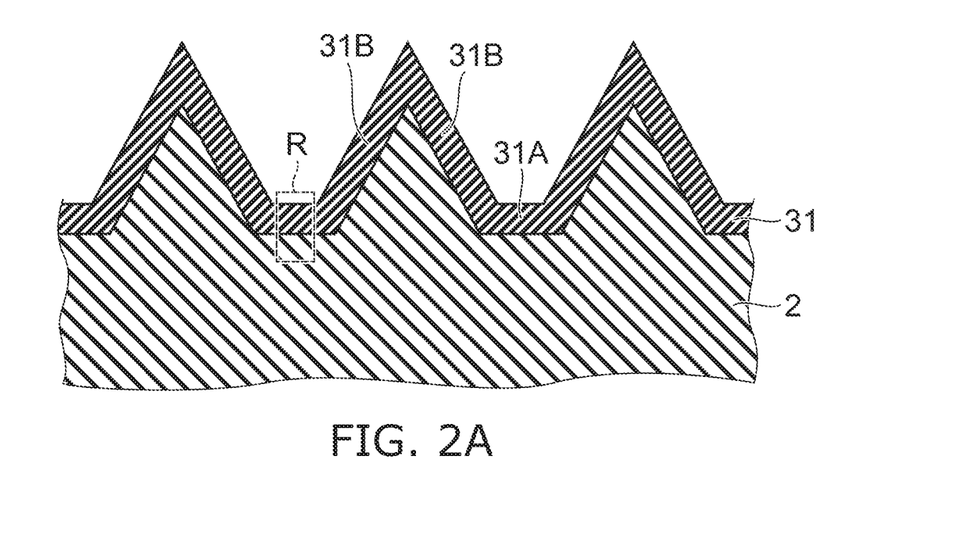
FIG. 2A and FIG. 2B are cross-sectional views in which portions of the semiconductor light-emitting element according to the embodiment are enlarged.
Figure 2B:
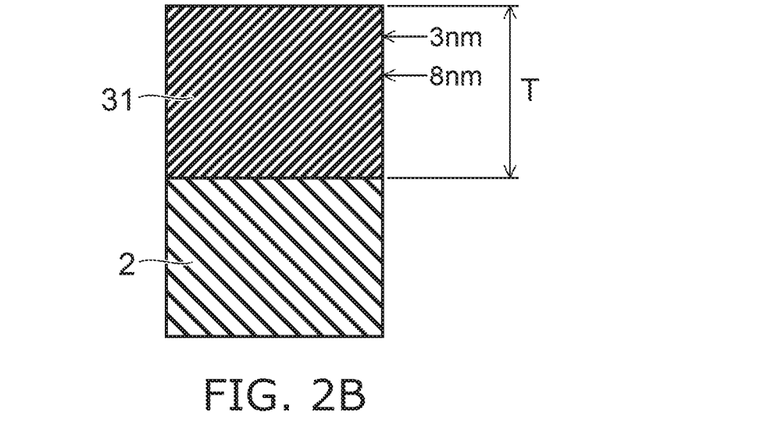

FIG. 2A and FIG. 2B are cross-sectional views in which portions of the semiconductor light-emitting element 1 according to the embodiment are enlarged.

As illustrated in FIG. 1, the semiconductor light-emitting element 1 according to the embodiment includes a substrate 2, a semiconductor layer 3, a reflective layer 4, an electrode 5, and an electrode 6. In the example illustrated in FIG. 1, the semiconductor light-emitting element 1 further includes a transparent electrode 7 and is mounted on a mounting substrate 8.

(Substrate 2)

Major components of the substrate 2 are, for example, at least one selected from the group consisting of $Al_2O_3$, GaN, Si (silicon), SiC, Si-on-diamond, ZnO, $LiAlO_2$, MgO, GaAs, Cu (copper), and W (tungsten). From the perspective of cost and characteristics, it is desirable for the substrate 2 to be a sapphire substrate. A sapphire substrate is one type of aluminum oxide ($Al_2O_3$) substrate. A fine uneven structure is provided in at least one of the front side or the backside of the substrate 2. FIG. 2A shows an example of the uneven structure. In the example illustrated in FIG. 2A, the uneven structure is provided in the front side of the substrate 2 (the side where the semiconductor layer 3 is formed). By providing the uneven structure, more of the light is reflected at the uneven structure. The light that is radiated from an active layer 34 (described below) includes light emitted outside the semiconductor light-emitting element 1, and light traveling toward the interior of the semiconductor light-emitting element 1. The light that travels toward the interior of the semiconductor light-emitting element 1 is reflected at the uneven structure, and more of the light is emitted outside the semiconductor light-emitting element 1;

and the light emission intensity and the luminous efficiency of the semiconductor light-emitting element 1 can be increased thereby.

As an example of the uneven structure, it is favorable for protrusions to be provided in the front surface of the substrate 2. The protrusions have, for example, circular conic configurations and/or polygonal pyramid configurations. It is favorable for the configurations of the protrusions in a cross section crossing the vertical direction to be polygons such as triangles, trapezoids, etc. The vertical direction is a direction connecting the electrode 5 or the electrode 6 with the substrate 2. Also, the reflection effect can be improved by the protrusions having oblique surfaces. It is favorable for the protrusions to be provided cyclically along directions (hereinbelow, called in-plane directions) perpendicular to the vertical direction. A sapphire substrate in which an uneven structure is provided cyclically in at least one of the front surface or the back surface is called a Patterned Sapphire Substrate (PSS). As the uneven structure, it is favorable for the diameter of the protrusion to be not less than 0.5 μn and not more than 5 μm, the height of the protrusion to be not less than 0.5 μm and not more than 5 μm, and the pitch to be within the range not less than 0.5 μn and not more than 5 μm. The pitch is the distance between the apexes of adjacent protrusions. In the case where the tip of the protrusion has a planar configuration (the cross section of the protrusion is a trapezoid), the distance between the centers of the planar surfaces of the tips is used as the pitch. By setting the size of the protrusion to be within the range recited above, the effect of the reflection at the uneven structure and the light extraction effect can be improved sufficiently.

(Semiconductor Layer 3)

The semiconductor layer 3 is provided at the front side of the substrate 2. For example, as illustrated in FIG. 1, it is favorable for the semiconductor layer 3 to include a buffer layer 31, an n-type semiconductor layer 32, a relaxation layer 33, an active layer (a light-emitting layer) 34, and a p-type semiconductor layer 35.

The buffer layer 31 is provided to improve the crystallinity of the semiconductor layers such as the active layer 34, etc., provided on the buffer layer 31. It is favorable for the buffer layer 31 to include an aluminum nitride (AlN)-based material. As illustrated in FIG. 2A, for example, the buffer layer 31 is provided along the uneven structure of the front surface of the substrate 2. In other words, in the example, the buffer layer 31 includes a flat portion 31A along the in-plane direction, and an oblique portion 31B provided at the oblique surface of the uneven structure. The thickness of the buffer layer 31 is, for example, not less than 10 nm and not more than 100 nm. FIG. 2B is an enlargement of region R of FIG. 2A. As illustrated in FIG. 2B, a thickness T of the buffer layer 31 can be determined by measuring the dimension in the vertical direction of the flat portion 31A. Or, the thickness of the buffer layer 31 may be determined by measuring the dimension of the oblique portion 31B in the normal direction of the oblique surface of the uneven structure.

For example, an n-type cladding layer or the like is an example of the n-type semiconductor layer 32. A GaN layer doped with Si or the like is an example of the n-type cladding layer.

The inventors discovered that it is effective for at least a portion of the n-type cladding layer to include Al to obtain a semiconductor light-emitting element in which the light emission peak wavelength is not less than 380 nm and not more than 425 nm, the light can be radiated with high efficiency, and the light-emitting surface is uniform. In particular, by including Al in the entire n-type cladding layer, it is possible to dope the n-type cladding layer with a high concentration of Si; and the resistance of the n-type cladding layer can be reduced by the increase of the dopant concentration. An example of high-concentration Si is not less than $8 \times 10^{18}$ atm/cm$^3$ and not more than $5 \times 10^{19}$ atm/cm$^3$. Also, the Si concentration can be detected by SIMS analysis.

Also, the spreading of the current of the entire n-type cladding layer can be made uniform by inserting an $Al_xGa_{1-x}N$ ($0.05 \leq x \leq 0.15$) layer having a higher resistance than GaN into a portion of the n-type cladding layer. The component ratios in the $Al_xGa_{1-x}N$ layer can be confirmed from TEM-EDX analysis results.

Thus, a semiconductor light-emitting element that has a uniform light-emitting surface and high efficiency can be realized by including Al in the n-type cladding layer.

It is favorable for the concentration of Al in the n-type cladding layer to be not less than 1 at % and not more than 15 at %. More favorably, the concentration of Al in the n-type cladding layer is not less than 1 at % and not more than 6 at %. Also, in the case where the n-type semiconductor layer 32 includes a high-resistance AlGaN layer, it is favorable for the concentration of Al in the n-type semiconductor layer 32 to be not less than 5 at % and not more than 15 at %. It is favorable for the thickness of the AlGaN layer to be not less than 20 nm and not more than 80 nm.

Also, a GaN layer to which an impurity is not added may be provided between the buffer layer 31 and the n-type semiconductor layer 32.

The active layer 34 functions as a light-emitting layer. For example, an InGaN layer, a GaN layer, an InAlGaN layer, an AlGaN layer, a stacked structure in which these layers are overlaid, etc., are examples of the active layer 34. For example, at least a portion of the active layer 34 is a stacked structure of an $In_{x1}Al_{y1}Ga_{1-x1-y1}N$ ($0<x1 \leq 0.15$ and $0 \leq y1 \leq 0.2$) layer and an $Al_{y2}Ga_{1-y2}N$ ($0 \leq y2 \leq 0.2$) layer. To obtain a semiconductor light-emitting element in which the light emission peak wavelength is not less than 380 nm and not more than 425 nm and the light emission wavelength is shorter than that of a blue semiconductor light-emitting element, it is favorable for the active layer 34 to include Al. It is favorable for the concentration of Al in the active layer 34 to be not less than 5 at % and not more than 10 at %.

The "Al concentration in the active layer 34" means the Al concentration in a single layer. In the case where the active layer 34 has a stacked structure, the "Al concentration in the active layer 34" refers to the Al concentration in the single layer that includes Al and is included in the stacked structure. An InGaN layer, a GaN layer, an InAlGaN layer, an AlGaN layer, etc., are examples of the single layer including Al. Also, the "single layer" refers to a layer having a crystalline phase of the same composition.

For example, the confirmation of the Al concentration in the active layer 34 is performed by the following method. SIMS (Secondary Ion Mass Spectrometry) analysis of the region including the active layer 34 is performed. The composition and the position of each layer are ascertained thereby. After ascertaining the composition and the position of the single layers, line analysis is performed using (S)TEM ((scanning) transmission electron microscope ((Scanning) Transmission Electron Microscope))-EDX (energy dispersive X-ray spectroscopy (Energy Dispersive X-ray Spectroscopy)). The line analysis is performed for the vertical direction of the semiconductor structure. The concentration of Al is calculated from the detected value of Al detected by EDX. In the case of a stacked structure, the average value of the multiple Al peak values is used as the Al concentration. For the average value, the average value within the range from the maximum detected value of Al to 70% intensity is used as the content (the concentration) of Al. For example, an $In_xAl_yGa_zN$ single layer is expressed as $x+y+z=1$ ($x≥0$, $y≥0$, and $z≥0$); and the Al concentration is the value of y.

For example, the SIMS analysis can be performed using the CAMECA IMS-7f made by Ametek, Inc. The measurement conditions are, for example, as follows.

Primary ion species: Cs+
Primary acceleration voltage: 3.0 kV
Detection region: 30 (μmφ)

For example, the analysis by STEM-EDX can be performed using the JEM-ARM200F made by JEOL Ltd. The conditions when performing the analysis are, for example, as follows.

Acceleration voltage: 200 kV
Beam diameter: about 0.1 nmφ
X-ray take-off angle: 21.9°
Solid angle: 0.98 sr
Overall magnification: 16,000 to 1,600,000 times
Reading points: 300 points
STEM scan rate: 1 measurement point/sec The relaxation layer 33 can be provided between the n-type semiconductor layer 32 and the active layer 34. By providing the relaxation layer 33, the distortion of the crystal in the active layer 34 can be relaxed; and the crystallinity of the active layer 34 can be improved. An InGaN layer, a GaN layer, an InAlGaN layer, an AlGaN layer, a superlattice layer in which these layers are stacked, etc., are examples of the relaxation layer 33. The relaxation layer 33 is, for example, an $In_{x3}Al_{y3}Ga_{1-x3-y3}N$ ($0<x3≤0.05$ and $0≤y3≤0.08$) layer. Or, the relaxation layer 33 has a superlattice structure in which $In_{x4}Al_{y4}Ga_{1-x4-y4}N$ ($0<x4≤0.08$ and $0≤y4≤0.08$) and $Al_{y5}Ga_{1-y5}N$ ($0≤y5≤0.08$) are stacked alternately. In the case where the active layer 34 includes Al, it is favorable for the relaxation layer 33 also to include Al to improve the lattice matching between the relaxation layer 33 and the active layer 34.

A p-type contact layer, a p-type cladding layer, a layer in which a p-type contact layer and a p-type cladding layer are combined, etc., are examples of the p-type semiconductor layer 35. A GaN layer doped with an impurity element or the like is an example of the p-type contact layer. Mg (magnesium) or the like is an example of the impurity element. An AlGaN layer or a GaN layer doped with an impurity element, etc., are examples of the p-type cladding layer.

As recited above, the semiconductor layer 3 has a multilayer structure. In the n-type semiconductor layer 32, the carriers are electrons; and in the p-type semiconductor layer 35, the carriers are holes. Recombination occurs at the p-n junction portion by the electrons and the holes colliding and being annihilated. When recombining, energy that corresponds to the difference between the energy of the electrons and the energy of the holes is emitted as light. In the semiconductor layer 3, the electrons and the holes can be accumulated efficiently by using a multilayer structure in which the p-type semiconductor layer 35 and the n-type semiconductor layer 32 are not directly bonded, and another layer is provided between the p-type semiconductor layer 35 and the n-type semiconductor layer 32. The luminous efficiency can be increased thereby.

(Reflective Layer 4)

The reflective layer 4 is provided at the backside of the substrate 2. The backside of the substrate 2 is the surface of the substrate 2 on the side opposite to the surface of the substrate 2 on the side where the semiconductor layer 3 is provided. As the reflective layer 4, it is favorable to use a metal reflective layer, a multilayer reflective layer having a structure in which a first dielectric layer and a second dielectric layer are stacked alternately, or both. When both are used, the multilayer reflective layer is provided on the metal reflective layer; and the substrate 2 is provided on the multilayer reflective layer. The first dielectric layer of the multilayer reflective layer is made of titanium oxide, zirconium oxide, silicon nitride, niobium oxide, tantalum oxide, etc. The second dielectric layer is made of silicon oxide, magnesium fluoride, calcium fluoride, etc. These layers can be formed by thin film formation technology such as sputtering, etc. It is favorable for the metal reflective layer to include at least one selected from the group consisting of Au, Ag, and Al as a major component. For example, the metal reflective layer includes simple Au, a Au alloy, simple Ag, a Ag alloy, simple Al, or an Al alloy as a major component. For example, a AgPdCu alloy is an example of the Ag alloy. Simple Ag, a Ag alloy, simple Al, and an Al alloy are favorable compared to simple Au and a Au alloy because the reflectance to light having a wavelength of 380 to 425 nm is higher. Also, Ag and Al are favorable compared to Au because Ag and Al are inexpensive.

(Electrode 5 and Electrode 6)

The electrode 5 and the electrode 6 are provided on the semiconductor layer 3. In FIG. 1, the electrode 5 functions as a p-pad electrode; and the electrode 6 functions as an n-pad electrode.

The electrode 5 and the electrode 6 can be electrically connected with other components by wire bonding, etc. A Au layer, a Au alloy layer, a Au/Ti stacked structure, a Au/Pd stacked structure, a Au/Al stacked structure, a Ni/Pd stacked structure, a Au/Ni stacked structure, etc., are examples of the electrode 5 and the electrode 6. These structures are favorable as the electrode 5 and the electrode 6 because the adhesion with bonding wire is good.

(Transparent Electrode 7)

The transparent electrode 7 can be provided in at least one of between the semiconductor layer 3 and the electrode 5 and between the semiconductor layer 3 and the electrode 6. In the example illustrated in FIG. 1, the transparent electrode 7 is provided between the semiconductor layer 3 and the electrode 5. The transparent electrode 7 may be provided between the semiconductor layer 3 and the electrode 6. The transparent electrode 7 transmits light. An indium-tin-oxide (Indium Tin Oxide: ITO) layer, an indium-zinc-oxide (Indium Zinc Oxide: IZO) layer, a zinc oxide layer, a tin oxide layer, etc., are examples of the transparent electrode 7.

(Mounting Substrate 8)

The mounting substrate 8 is a substrate for mounting the semiconductor light-emitting element 1. The mounting substrate 8 is differentiated from the substrate 2 which is for growing the semiconductor layer 3. It is favorable for the reflectance of the mounting substrate 8 to be high to efficiently reflect the light radiated from the semiconductor layer 3. Also, it is desirable to further increase the luminance of the light-emitting device using the semiconductor light-emitting element 1. Therefore, a high-output light-emitting device includes features such as a large input power and/or a high junction temperature; and it is desirable for the heat dissipation of the mounting substrate 8 to be good. From these perspectives, a metal substrate is an example of the mounting substrate 8. An Al sheet is favorable as the metal substrate. A ceramic substrate that is covered with silver (Ag), aluminum (Al), or aluminum oxide ($Al_2O_3$) also is effective. A silicon nitride substrate, an aluminum nitride substrate, and an aluminum oxide substrate are favorable as the ceramic substrate. When mounting the semiconductor light-emitting element 1 on the mounting substrate 8, the semiconductor light-emitting element 1 may be directly mounted or may be mounted via a bonding agent layer, etc.

Effects of the embodiment will now be described.

As described above, the light emission peak wavelength of the semiconductor light-emitting element 1 according to the embodiment is not less than 380 nm and not more than 425 nm, and is a shorter wavelength than that of a conventional blue semiconductor light-emitting element. In such a semiconductor light-emitting element 1, the semiconductor layer 3 includes the buffer layer 31 made of AlN. Because the semiconductor layer 3 includes the buffer layer 31, the crystallinity of the n-type semiconductor layer 32, the active layer 34, and the p-type semiconductor layer 35 is improved; and the light emission intensity of the semiconductor light-emitting element 1 can be increased. Also, by providing the semiconductor layer 3 on the substrate 2 such as a PSS, etc., having an uneven structure in the front surface, it is possible to further increase the luminous efficiency of the semiconductor light-emitting element 1.

Also, the inventors discovered that by including Al in the n-type semiconductor layer 32 in the semiconductor light-emitting element 1 having the light emission peak wavelength not less than 380 nm and not more than 425 nm, the resistance of the n-type semiconductor layer 32 is reduced; the uniformity of the light emission in the in-plane direction is increased; and the life of the semiconductor light-emitting element 1 is extended.

On the other hand, it was found that in the case where the n-type semiconductor layer 32 includes Al, the crystallinities of the n-type semiconductor layer 32, the active layer 34, and the p-type semiconductor layer 35 decrease; and the light emission intensity and the luminous efficiency of the semiconductor light-emitting element decrease.

As a result of experiments performed to solve this problem, the inventors discovered the buffer layer 31 by which the crystallinities of the n-type semiconductor layer 32, the active layer 34, and the p-type semiconductor layer 35 can be improved, and the light emission intensity of the semiconductor light-emitting element can be increased. The buffer layer 31 is made of aluminum nitride and has the feature of the oxygen concentration at the n-type semiconductor layer 32 side and the oxygen concentration at the interior side being different. Specifically, in the buffer layers 31, $0.01 \leq O_{8nm}/O_{3nm} \leq 0.5$ is satisfied, where $O_{3nm}$ (at %) is the oxygen concentration at a depth of 3 nm, and $O_{8nm}$ (at %) is the oxygen concentration at a depth of 8 nm.

By using the buffer layer 31, the crystallinities of the n-type semiconductor layer 32, the active layer 34, and the p-type semiconductor layer 35 can be improved. It is considered that the reason for this is as follows.

The lattice constant of a GaN-based semiconductor layer is about 3.189 to 3.545; and the lattice constant of a buffer layer made of AlN is about 3.111. In the case where a PSS is used as the substrate 2, the lattice constant of the PSS is about 4.758. If the GaN-based semiconductor layer includes Al, the lattice constant becomes small; and the lattice mismatch with the substrate 2 becomes large. As a result, the crystallinities of the n-type semiconductor layer 32, the active layer 34, and the p-type semiconductor layer 35 decrease; and the characteristics of the semiconductor light-emitting element also degrade.

However, in the semiconductor light-emitting element 1 according to the embodiment, the buffer layer 31 is made of aluminum nitride and includes oxygen. By including oxygen in the buffer layer 31, the lattice constant of the buffer layer 31 can be large. For example, when 20 at % or less of oxygen is included in the buffer layer 31, the lattice constant of the buffer layer 31 is about 3.111 to 3.440. As a result, the lattice mismatch between the buffer layer 31 and the n-type semiconductor layer 32 can be reduced; and the crystallinities of the n-type semiconductor layer 32, the active layer 34, and the p-type semiconductor layer 35 can be improved. Also, the lattice constant of the sapphire substrate is about 4.758. In the case where the substrate 2 is a sapphire substrate, by increasing the lattice constant of the buffer layer 31, the lattice mismatch between the substrate 2 and the buffer layer 31 also can be reduced; and the crystallinities of the n-type semiconductor layer 32, the active layer 34, and the p-type semiconductor layer 35 can be improved further. It is considered that the light emission characteristics of the semiconductor light-emitting element can be improved thereby.

Or, it is considered that in the case where the semiconductor layer 3 is grown on the substrate 2 such as a PSS having a fine uneven structure in the front surface, the buffer layer 31 that is made of aluminum nitride and has an oxygen concentration distribution is suitable.

Also, the heat dissipation of the buffer layer 31 decreases when oxygen is included in the buffer layer 31 made of aluminum nitride; but in the embodiment, the oxygen concentration in the buffer layer 31 satisfies $0.01 \leq O_{8nm}/O_{3nm} \leq 0.5$. In other words, the oxygen concentration is reduced in the deep portion away from the front surface of the buffer layer 31 (the surface on the n-type semiconductor layer 32 side) compared to the region more on the front side of the buffer layer 31. Accordingly, according to the embodiment, the crystallinities of the n-type semiconductor layer 32, the active layer 34, and the p-type semiconductor layer 35 can be improved while suppressing the decrease of the heat dissipation of the buffer layer 31. Also, the decrease of the heat dissipation of the buffer layer 31 can be suppressed further because $O_{8nm}$ and $O_{3nm}$ each are 20 at % or less.

According to the embodiment as described above, it is possible to realize the light emission intensity improvement and the heat dissipation improvement due to the buffer layer 31, and the uniformity improvement of the light emission, the longer life of the semiconductor light-emitting element 1, and the longer life of the peripheral circuit due to the n-type semiconductor layer 32 including Al.

Further, in the semiconductor light-emitting element 1 according to the embodiment, it is favorable for the relaxation layer 33 and/or the active layer 34 also to include Al. By the relaxation layer 33 and the active layer 34 including Al, the crystallinities of the relaxation layer 33 and the active layer 34 can be improved. Also, by including Al in the active layer 34, the wavelength of the light radiated from the active layer 34 can be short; for example, the semiconductor light-emitting element 1 can be obtained in which the light emission peak wavelength is not less than 380 nm and not more than 425 nm, and even not less than 400 nm and not more than 420 nm. It is favorable for the concentration of Al in the active layer 34 to be not less than 5 at % and not more than 10 at % to shorten the light emission peak wavelength of the semiconductor light-emitting element 1 and improve the crystallinity of the active layer 34.

It is favorable for the thickness of the buffer layer 31 used in the semiconductor light-emitting element 1 of the embodiment to be not less than 10 nm and not more than 100 nm. More favorably, the thickness of the buffer layer 31 is not less than 12 nm and not more than 40 nm. Also, as a result of diligent investigations by the inventors, it is favorable for 0.003≤A/B≤1.0 to be satisfied, where A is the thickness of the buffer layer 31, and B is the sum total of the thicknesses of the n-type semiconductor layer 32 and the relaxation layer 33. Also, it is favorable for 0.09≤A/C≤2.9 to be satisfied, where C is the thickness of the active layer 34. It was found that by satisfying the conditions recited above, the lattice constant matching is good; and the active layer 34 having good crystallinity is obtained.

For the thickness of the n-type semiconductor layers 32, SIMS analysis of the Si distribution inside the GaN layer is performed. The region where Si is detected is taken as the thickness of the n-type semiconductor layer 32.

Also, it is favorable for the width at half maximum of the (0002) plane in the X-ray diffraction measurement of the buffer layer 31 to be 350 arcsec or less. A small width at half maximum indicates that the buffer layer 31 has good crystallinity. Also, the tilt (the tilt of the crystal axis) distribution can be evaluated using the width at half maximum.

Also, it is favorable for the width at half maximum of the (0002) plane in the X-ray diffraction measurement of the semiconductor light-emitting element 1 (the chip after stacking the semiconductor layer 3) to be 200 arcsec or less. Also, it is favorable for the width at half maximum of the (10-12) plane in the X-ray diffraction measurement of the semiconductor light-emitting element 1 to be 250 arcsec or less. This indicates that the crystallinity of the semiconductor layer 3 of the semiconductor light-emitting element 1 is good. The tilt (the tilt of the crystal axis) distribution and the twist (the rotation of the crystal axis) distribution of the semiconductor layer (the LED structure) can be evaluated using the width at half maximum.

The optimization of the width at half maximum indicates that the semiconductor layer 3 is optimized and the lattice mismatch described above is improved. Also, arcsec is the abbreviation of arcsecond.

An example of the analysis method of the semiconductor light-emitting element will now be described.

For example, the semiconductor light-emitting element can be analyzed using (S)TEM-EDX.

First, as pre-processing of the sample, thinning is performed by a technique such as a FIB (focused-ion beam) technique (μ-sampling), etc. Specifically, the semiconductor light-emitting element is cut along the thickness direction (the vertical direction). This processing is performed by embedding the semiconductor light-emitting element in a resin.

For example, the buffer layer that is formed on the substrate is provided along the uneven structure of the substrate front surface as illustrated in FIG. 2A. In such a case, the flat portion of the buffer layer is observed using STEM. As illustrated in FIG. 2B, point analysis is performed using EDX for portions at depths of 3 nm and 8 nm from the interface (the front surface of the buffer layer) between the flat portion and the other semiconductor layer (e.g., the n-type semiconductor layer). Or, instead of point analysis, line analysis that includes depths of 3 nm and 8 nm may be performed. The oxygen concentration $O_{3nm}$ (at %) at the position of 3 nm and the oxygen concentration $O_{8nm}$ (at %) at the position of 8 nm from the front surface of the flat portion are determined from the results of the analysis; and $O_{8nm}/O_{3nm}$ is calculated.

For example, the analysis by STEM-EDX can be performed using the JEM-ARM200F made by JEOL Ltd. The conditions when performing the analysis are, for example, as follows.

Acceleration voltage: 200 kV
Beam diameter: about 0.1 nmϕ
X-ray take-off angle: 21.9°
Solid angle: 0.98 sr
Overall magnification: 16,000 to 1,600,000 times
Reading points: 300 points
STEM scan rate: 1 measurement point/sec Elements of Ga, In, Al, N, etc., included in the active layer, the relaxation layer, and the n-type semiconductor layer can be confirmed using STEM-EDX. Before confirming using STEM-EDX, the positions of the layers of the semiconductor structure are ascertained from the contrast of a STEM observation, etc. At this time, by performing SIMS (Secondary Ion Mass Spectrometry), etc., beforehand, the structure and/or the position of the active layer is ascertained more easily. Also, the Si element existing in the n-type semiconductor layer is confirmed using SIMS analysis. Line analysis by STEM-EDX is performed for the layers. The line analysis is performed in the vertical direction of the semiconductor structure.

In the case where the active layer has a stacked structure made of multiple layers, line analysis is performed for the location estimated to be the active layer by using STEM. The average value of the multiple In peak values and the average value of the multiple Al peak values that are detected are used respectively as the contents of In and Al in the active layer. In the case where the active layer is made of a single-layer, the average value within the range from the maximum detected value of In to 80% intensity is used as the In content in the active layer; and the average value within the range from the maximum detected value of Al to 70% intensity is used as the Al content in the active layer.

In the case where the relaxation layer has a stacked structure including multiple layers, the average value of the multiple In peak values and the average value of the multiple Al peak values detected from the location estimated to be the relaxation layer by STEM are respectively used as the contents of In and Al in the relaxation layer. In the case where the relaxation layer is made of a single-layer, the average value within the range from the maximum detected value of In to 50% intensity is used as the In content in the relaxation layer; and the average value within the range from the maximum detected value of Al to 50% intensity is used as the Al content in the relaxation layer.

For the n-type semiconductor layer, the average value of Al detected from the location estimated to be the n-type semiconductor layer by STEM is used as the Al content in the n-type semiconductor layer. In the case where Al is included in the entire n-type semiconductor layer, the average value within the range from the maximum detected value to 35% intensity is used as the Al content in the n-type semiconductor layer. In the case where a portion of the n-type semiconductor layer is an AlGaN layer, the average value within the range from the maximum detected value of Al to 60% intensity is used as the composition ratio of the Al content in the AlGaN layer. Also, the concentration (at %) of each element in the layers can be calculated using the content of Al (aluminum) and In (indium) determined by the methods described above and the intensity ratio (the Count number) of all of the elements of the layers detected by STEM-EDX.

The analysis of the semiconductor light-emitting element may be performed using SIMS (secondary ion mass spectrometry (Secondary Ion Mass Spectrometry)).

When SIMS is used, for example, two layers including In are detected. In such a case, the upper layer can be determined to be the active layer; and the lower layer can be determined to be the relaxation layer. In the case where the relaxation layer is not provided, one layer including In is detected. The layer can be determined to be the active layer. In the case of a face-up structure LED, the p-type semiconductor layer is provided higher than the active layer. The n-type semiconductor layer is positioned lower than the active layer. In the case where the relaxation layer is provided, the n-type semiconductor layer is positioned lower than the relaxation layer. A p-type impurity such as Mg or the like is detected from the p-type semiconductor layer; and an n-type impurity such as Si or the like is detected from the n-type semiconductor layer. Accordingly, the position of the active layer can be identified; and the positions of the n-type semiconductor layer and the p-type semiconductor layer each can be identified from the detection results of these impurities. The buffer layer is positioned lower than the n-type semiconductor layer. The position of the buffer layer can be identified from the contrast of a HAADF (high-angle annular dark-field) image in a cross section STEM observation of the LED structure and from the elemental analysis results of STEM-EDX.

For example, SIMS can be performed using the CAMECA IMS-7f made by the Ametek, Inc. The measurement conditions can be, for example, as follows.

Primary ion species: Cs+
Primary acceleration voltage: 3.0 kV
Detection region: 30 (μmφ)

Also, the measurement method of X-ray diffraction (X-ray diffraction: XRD) is as follows. First, the measurement of the width at half maximum of the buffer layer is performed using a wafer or a semiconductor light-emitting element (a chip after the other semiconductor layers are stacked on the buffer layer 31) in which the buffer layer 31 is provided on the substrate 2. For example, XRD can be performed using SmartLab made by Rigaku Corporation. For example, the measurement conditions are as follows.

Tube voltage: 45 kV
Tube current: 200 mA
Wavelength monochromaticity: Kα1 (Cu target)
Incidence/receiving slit width: 1 mm Also, the XRD measurement of the semiconductor light-emitting element (the entire LED structure) is performed using a chip after stacking to provide the LED structure. For example, XRD can be performed using SmartLab made by Rigaku Corporation. For example, the measurement conditions are as follows.

Tube voltage: 45 kV
Tube current: 200 mA
Wavelength monochromaticity: Kα1 (Cu target)
Incidence/receiving slit width: 0.1 mm An example of a method for manufacturing the semiconductor light-emitting element 1 according to the embodiment will now be described.

First, the substrate 2 that has a fine uneven structure in the front surface is prepared. The buffer layer 31 is formed on the front surface of the substrate 2. For example, the buffer layer 31 can be formed by sputtering using an AlN target including oxygen. The oxygen content of the AlN target is, for example, not less than 10 wtppm and not more than 100 wtppm.

For example, initially, AlN is formed as a film by using an AlN target having a relatively low oxygen content; then, AlN is formed as a film by using an AlN target having a relatively high oxygen content; thereby, the buffer layer 31 that has a concentration distribution of oxygen in the thickness direction is formed. Or, initially, AlN is formed as a film by using an AlN target including oxygen; then, oxygen is introduced to the film formation space while sputtering the AlN target; thereby, the buffer layer 31 that has a concentration distribution of oxygen in the thickness direction is formed.

When performing sputtering, it is favorable for the temperature of the substrate 2 to be not less than 400° C. and not more than 800° C. Also, it is favorable for the sputtering to be performed in a vacuum of $1.0 \times 10^{-4}$ Pa or less. By sputtering in a vacuum of $1.0 \times 10^{-4}$ Pa or less, the oxygen amount mixed into the buffer layer 31 can be reduced; and the concentration distribution of oxygen in the thickness direction of the buffer layer 31 can be set to be large. When sputtering the AlN target, it is favorable for the output of the sputtering apparatus to be not less than 150 W and not more than 400 W. Also, the buffer layer 31 may be formed using a metal organic chemical vapor deposition (Metal Organic Chemical Vapor Deposition: MOCVD) technique, a physical vapor deposition (Physical Vapor Deposition: PVD) technique, etc.

It is favorable to perform heat treatment of the buffer layer 31 at not less than 1200° C. and not more than 1800° C. in an inert gas atmosphere of nitrogen, etc. The crystallinity of the buffer layer 31 improves due to the heat treatment. Also, by improving the crystallinity of the buffer layer 31, the oxygen that is included in the interior of the buffer layer 31 moves toward the outer portion of the buffer layer 31; and the concentration distribution of oxygen in the thickness direction of the buffer layer 31 can be set to be large.

Continuing, the semiconductor layer 3 is formed by sequentially forming the n-type semiconductor layer 32, the relaxation layer 33, the active layer 34, and the p-type semiconductor layer 35 on the buffer layer 31. It is favorable for the methods for forming the layers of the semiconductor layer 3 to be a metal-organic vapor phase epitaxy (Metal-Organic Vapor Phase Epitaxy: MOVPE) technique. The MOVPE technique is a method of forming a semiconductor layer to cause multiple metal-organic gases to react. Various semiconductor layers of GaN, InGaN, AlGaN, InAlGaN, etc., can be formed. Trimethylgallium (TMGa) or triethylgallium (TEGa) is an example of a metal-organic gas used as the source material of Ga. Trimethyl aluminum (TMAl) is an example of a metal-organic gas used as the source material of Al. Trimethylindium (TMIn) is an example of a metal-organic gas used as the source material of In. The layers of the semiconductor layer 3 can be sequentially grown by supplying the metal-organic gas on the substrate 2 heated inside the MOVPE apparatus. The layers may be doped with impurity elements when growing as necessary.

The electrode 5 (the p-pad electrode) and the electrode 6 (the n-pad electrode) are formed after forming the semiconductor layer 3. The transparent electrode 7 may be formed between the semiconductor layer 3 and these electrodes as necessary. For example, the electrode 5 and the electrode 6 can be formed by sputtering and/or electron beam (Electron Beam: EB) vapor deposition. For example, the transparent electrode 7 can be formed by sputtering.

For example, the reflective layer 4 is formed by alternately stacking the first dielectric layer and the second dielectric layer described above at the backside of the substrate 2. For example, these dielectric layers can be formed by physical vapor deposition. Vacuum vapor deposition, molecular beam deposition (MBE), ion plating, ion beam deposition, sputtering, etc., are examples of physical vapor deposition. Ion-beam assisted deposition (Ion-beam Assisted Deposition: IAD) also is useful. IAD is a method of forming a dense film by irradiating gas ions from an ion gun in the vacuum vapor deposition. It is also effective to neutralize by accelerating the same amount of electrons when irradiating the gas ions. A dense and flat multilayer film can be formed by using IAD. In the reflective layer 4, the first dielectric layer is provided at the substrate 2 side; then, the second dielectric layer and the first dielectric layer are formed by alternately forming.

A metal reflective layer also may be formed under the reflective layer 4 as necessary. For example, the metal reflective layer can be formed by sputtering and/or electron beam vapor deposition.

A protective layer that covers the semiconductor layer 3 or the entire semiconductor light-emitting element 1 may be formed as necessary for the semiconductor light-emitting element 1 made in the subsequent processes.

Then, the semiconductor light-emitting element 1 is mounted to the mounting substrate 8. In the mounting process, a bonding layer between the reflective layer 4 and the mounting substrate 8 may be provided if the adhesion between the reflective layer 4 and the mounting substrate 8 is insufficient. Flip chip mounting of the semiconductor light-emitting element 1 on the mounting substrate 8 may be performed.

Examples

Semiconductor light-emitting elements according to examples of the invention and semiconductor light-emitting elements according to comparative examples will now be described.

The semiconductor light-emitting elements according to the examples and the comparative examples were made as follows.

Table 1 for the oxygen amounts and the thicknesses of the AlN buffer layers. Also, an AlN sputtering target (oxygen content of 30 wtppm) was used in the sputtering.

An n-type semiconductor layer, a relaxation layer, an active layer, and a p-type semiconductor layer were provided on the AlN buffer layer by using a MOCVD apparatus to have a light emission peak wavelength not less than 380 nm and not more than 425 nm. The compositions and the thicknesses of the n-type semiconductor layer, the relaxation layer, and the active layer are as shown in Table 1. For all of the examples and the comparative examples, the p-type semiconductor layer had a stacked structure of p-GaN (Mg concentration: $2.5 \times 10^{19}$ cm$^{-3}$)/p-Al$_{0.17}$Ga$_{0.83}$N (Mg concentration: $3.0 \times 10^{19}$ cm$^{-3}$).

The comparative example 1 is a comparative example in which the oxygen distribution in the depth direction of the AlN buffer layer is changed by using an oxygen-including atmosphere when sputtering. Also, the comparative example 2 is a comparative example in which the oxygen distribution in the depth direction of the AlN buffer layer was made uniform by sputtering an Al sputtering target in an oxygen-including atmosphere.

Also, for the relaxation layer and the active layer, the range from the upper limit to the lower limit for the composition and the film thickness of each single-layer of the stacked structure is indicated using "~". The composition and the film thickness of each layer were measured using the methods recited above in the description. Also, the Si concentration of the n-type semiconductor layer for the example 1 and the example 2 was within the range of $8 \times 10^{18}$ to $5 \times 10^{19}$ atm/cm$^3$.

TABLE 1

| | AlN buffer layer | | | | | |
|---|---|---|---|---|---|---|
| | $O_{8nm}/O_{3nm}$ | Oxygen concentration ($O_{3nm}$ (at %)) | Thickness (nm) | n-type semiconductor layer | Relaxation layer (Composition, thickness) | Active layer (Composition, thickness) |
| Example 1 | 0.4 | 18 | 22.4 | n-Al$_{0.01}$Ga$_{0.99}$N (2411 nm) | {In$_{0.03\sim0.04}$Ga$_{0.96\sim0.97}$N (3.0~3.8 nm)/ GaN(2.9~3.5 nm)} × 10 | {In$_{0.05\sim0.07}$Ga$_{0.95\sim0.93}$N(3.0~3.2 nm)/ GaN(8.0~9.0 nm)} × 5 |
| Example 2 | 0.2 | 15 | 42.4 | n-Al$_{0.03}$Ga$_{0.97}$N (2373 nm) | {In$_{0.03\sim0.04}$Ga$_{0.96\sim0.97}$N (3.0~3.8 nm)/ GaN(2.9~3.5 nm)} × 10 | {In$_{0.05\sim0.07}$Ga$_{0.95\sim0.93}$N(3.0~3.2 nm)/ GaN(8.0~9.0 nm)} × 5 |
| Example 3 | 0.05 | 10 | 17.8 | n-GaN(363 nm)/ n-Al$_{0.09}$Ga$_{0.91}$N(50 nm)/ n-GaN(2690 nm) | {In$_{0.01\sim0.02}$Al$_{0.02\sim0.03}$Ga$_{0.95\sim0.97}$N (91 nm) | {In$_{0.06\sim0.07}$Ga$_{0.93\sim0.94}$N(2.8~3.2 nm)/ Al$_{0.07\sim0.08}$Ga$_{0.92\sim0.93}$N(4.0~4.5 nm)} × 6 |
| Example 4 | 0.3 | 25 | 80.5 | Al$_{0.01}$Ga$_{0.99}$N (2998 nm) | {In$_{0.01\sim0.02}$Ga$_{0.98\sim0.99}$N (3.2~3.8 nm)/ GaN3.1~3.7 nm)} × 1 | {In$_{0.03\sim0.05}$Ga$_{0.95\sim0.97}$N(3.0~4.0 nm)/ GaN(6.6~7.3 nm)} × 6 |
| Example 5 | 0.07 | 12 | 18.3 | n-GaN(355 nm)/ n-Al$_{0.1}$Ga$_{0.9}$N(50 nm)/ n-GaN(2680 nm) | {In$_{0.015\sim0.025}$Al$_{0.015\sim0.025}$Ga$_{0.95\sim0.97}$N(90 nm) | {In$_{0.06\sim0.07}$Ga$_{0.93\sim0.94}$N(2.9~3.2 nm)/ GaN(3.9~4.4 nm)} × 6 |
| Comparative example 1 | 0.7 | 25 | 39.3 | n-Al$_{0.02}$Ga$_{0.98}$N (2411 nm) | {In$_{0.03\sim0.04}$Ga$_{0.96\sim0.97}$N (3.0~3.8 nm)/ GaN(2.9~3.5 nm)} × 10 | {In$_{0.05\sim0.06}$Ga$_{0.94\sim0.95}$N(2.4~2.9 nm)/ Al$_{0.06\sim0.07}$Ga$_{0.93\sim0.94}$N(3.8~4.7m)} × 6 |
| Comparative example 2 | 1 | 18 | 78.3 | n-GaN(290 nm)/ n-Al$_{0.07}$Ga$_{0.93}$N(61 nm)/ n-GaN(2430 nm) | {In$_{0.01\sim0.02}$Al$_{0.02\sim0.03}$Ga$_{0.95\sim0.97}$N (91 nm) | [In$_{0.05\sim0.07}$Ga$_{0.95\sim0.93}$N(2.8~3.1 nm)/ GaN(13.0~14.5 nm)] × 5 |

A PSS is used as the substrate 2. In other words, the substrate 2 is a sapphire substrate having a fine uneven structure in the front surface. The substrate 2 is heated to 600° C.; and an AlN buffer layer is provided on the front side of the substrate 2 by sputtering in an atmosphere of $1 \times 10^{-5}$ Pa. Annealing of the AlN buffer layer was performed for 1 hour at 1550° C. in a N$_2$ atmosphere. The conditions of the processes were controlled to obtain the values shown in When making the semiconductor light-emitting elements according to the examples and the comparative examples, the width at half maximum was determined by performing an X-ray diffraction (XRD) measurement of the AlN buffer layer before providing the n-type semiconductor layer, the relaxation layer, the active layer, and the p-type semiconductor layer. Also, after providing the n-type semiconductor layer, the relaxation layer, the active layer, and the p-type semiconductor layer, the width at half maximum was determined for the (0002) plane and the (10-12) plane by performing a ω-scan measurement using an XRD apparatus. The widths at half maximum are shown in Table 2.

TABLE 2

|  | AlN buffer layer XRD | XRD after stacking semiconductor layers | |
| --- | --- | --- | --- |
|  | Width at half maximum of (0002) plane | Width at half maximum of (0002) plane | Width at half maximum of (10-12) plane |
| Example 1 | 100 | 80 | 120 |
| Example 2 | 310 | 140 | 240 |
| Example 3 | 120 | 90 | 130 |
| Example 4 | 150 | 105 | 155 |
| Example 5 | 140 | 100 | 140 |
| Comparative example 1 | 370 | 230 | 300 |
| Comparative example 2 | 420 | 290 | 380 |

It can be seen from the table that the width at half maximum of the (0002) plane of the buffer layer was 350 arcsec or less for the semiconductor light-emitting elements according to the examples. Also, the width at half maximum of the (0002) plane was 200 arcsec or less for the semiconductor light-emitting elements according to the examples. Also, the width at half maximum of the (10-12) plane was 250 arcsec or less for the examples. It can be seen that each of the widths at half maximum is small, and the crystallinity is improved.

After forming the semiconductor layers, the semiconductor light-emitting element was made by sequentially providing ITO as a transparent electrode, Au/Ti as electrodes, and a AgPdCu layer as a reflective layer. The luminous efficiencies were determined for the semiconductor light-emitting elements that were made. The method for measuring the luminous efficiency is as follows.

The semiconductor light-emitting elements that were made were made into chips. The chip size of all of the semiconductor light-emitting elements was 0.18 mm². Each semiconductor light-emitting element is fixed on a mounting substrate by using silver paste, solder, a transparent bonding agent, etc. Each semiconductor light-emitting element is electrically connected with the mounting substrate by using a gold wire, etc. A total luminous flux measurement of the mounted semiconductor light-emitting element was performed using a total luminous flux measurement system (MCPD9800 made by Otsuka Electronics Co., Ltd.) including a photometric sphere. The external quantum efficiency of the semiconductor light-emitting element was calculated from the obtained results. Subsequently, a comparison of the light emission intensities of the semiconductor light-emitting elements was performed. The comparison is recited as a relative efficiency value using the external quantum efficiency of the semiconductor light-emitting element of the comparative example 1 as 100. Also, a junction temperature Tj of the light-emitting element was measured using the Vf measurement technique. Specifically, the temperature dependence of Vf was ascertained by measuring each Vf value while changing the ambient temperature of the semiconductor light-emitting element while supplying 1 mA. Using the Vf values, Tj was calculated from the Vf value when the surroundings of the semiconductor light-emitting element were set to a constant temperature (room temperature), a current of 35 A/cm² was supplied, and the semiconductor light-emitting element was in a state of emitting heat.

Subsequently, a comparison of Tj was performed for the semiconductor light-emitting elements. The comparison is recited as the relative values using Tj of the semiconductor light-emitting element of the comparative example 1 as 100. The results are shown in Table 3 recited below.

TABLE 3

|  | Peak wavelength | Relative efficiency | Relative junction temperature |
| --- | --- | --- | --- |
| Example 1 | 410 | 135 | 87 |
| Example 2 | 405 | 112 | 95 |
| Example 3 | 415 | 128 | 90 |
| Example 4 | 388 | 121 | 92 |
| Example 5 | 413 | 123 | 92 |
| Comparative example 1 | 395 | 100 | 100 |
| Comparative example 2 | 408 | 95 | 108 |

From the results shown in Table 3, in the semiconductor light-emitting elements according to the examples, compared to the semiconductor light-emitting elements according to the comparative examples, a high relative efficiency was possible with a peak wavelength in the range of 380 to 425 nm; and it was also possible to lower the relative junction temperature. This shows that compared to the semiconductor light-emitting elements according to the comparative examples, the semiconductor light-emitting elements according to the examples have high luminous efficiencies and are more suited to being ON for a long period of time.

Also, from the results shown in Table 2, it can be seen that for the semiconductor light-emitting elements according to the examples, the width at half maximum of the (0002) plane of the buffer layer is 350 arc.sec. or less, and compared to the semiconductor light-emitting elements according to the comparative examples, the crystallinity of the semiconductor layer 3 is high.

Also, comparing the example 3 and the example 5, the relative efficiency and the relative junction temperature are improved for the example 3. This is because an AlGaN layer including Al is used inside the relaxation layer of the example 3.

Also, good results for the relative efficiency and the relative junction temperature are obtained for the example 1 and the example 3. This is because for the example 1 and the example 3, the width at half maximum of the (0002) plane of the AlN buffer layer and the width at half maximum of the (0002) plane and the width at half maximum of the (10-12) plane after stacking the semiconductor layers are small. The effects of controlling the width at half maximum after controlling the oxygen distribution of the AlN buffer layer were confirmed.

Although several embodiments of the invention are illustrated hereinabove, these embodiments are presented as examples and are not intended to limit the scope of the invention. These novel embodiments may be implemented in other various forms; and various omissions, substitutions, modifications, etc., can be performed without departing from the spirit of the invention. These embodiments and their modifications are within the scope and spirit of the invention and are within the scope of the invention described in the claims and their equivalents. Also, the embodiments described above can be performed in combination with each other.

What is claimed is:

1. A semiconductor light-emitting element having a light emission peak wavelength not less than 380 nm and not more than 425 nm,
the semiconductor light-emitting element comprising:
a stacked structure including
a reflective layer,
a substrate provided on the reflective layer, and
a semiconductor layer provided on the substrate,
the substrate having an uneven structure provided in a surface of the substrate on the semiconductor layer side,
the semiconductor layer including
a buffer layer made of aluminum nitride and having a thickness not less than 10 nm and not more than 100 nm, and
a semiconductor sub-layer positioned on the buffer layer,
the buffer layer including oxygen, a concentration of oxygen in the buffer layer being at 20 at % or less, $0.01 \leq O_{8nm}/O_{3nm} \leq 0.5$ being satisfied, $O_{3nm}$ (at %) being an oxygen concentration at a depth of 3 nm from a boundary positioned between the buffer layer and the semiconductor sub-layer, $O_{8nm}$ (at %) being an oxygen concentration at a depth of 8 nm from the boundary.

2. The semiconductor light-emitting element according to claim 1, wherein the substrate is a sapphire substrate.

3. The semiconductor light-emitting element according to claim 1, wherein
the semiconductor sub-layer is of an n-type, and
at least a portion of the semiconductor sub-layer is an AlGaN layer.

4. The semiconductor light-emitting element according to claim 1, wherein
the semiconductor layer includes an active layer positioned on the buffer layer, and
at least a portion of the active layer is a stacked structure of an InAlGaN layer and an AlGaN layer.

5. The semiconductor light-emitting element according to claim 4, wherein
the semiconductor layer further includes a relaxation layer provided between the buffer layer and the active layer, and
the relaxation layer includes at least one of In or Al.

6. The semiconductor light-emitting element according to claim 5, wherein
the relaxation layer includes
an InAlGaN layer, or
a superlattice structure having an InAlGaN layer and an AlGaN layer provided alternately.

7. The semiconductor light-emitting element according to claim 1, wherein a width at half maximum of a (0002) plane in an X-ray diffraction measurement of the buffer layer is 350 arcsec or less.

8. The semiconductor light-emitting element according to claim 1, wherein the light emission peak wavelength is not less than 400 nm and not more than 420 nm.

9. A method for manufacturing the semiconductor light-emitting element according to claim 1, comprising forming the buffer layer by sputtering.

10. The method for manufacturing the semiconductor light-emitting element according to claim 9, wherein the sputtering is performed in a vacuum of $1 \times 10^{-4}$ Pa or less with a temperature of the substrate set to be not less than 400° C. and not more than 800° C.

11. The method for manufacturing the semiconductor light-emitting element according to claim 9, wherein heat treatment of the buffer layer is performed in an inert gas atmosphere at not less than 1200° C. and not more than 1800° C. after the forming of the buffer layer.

12. The semiconductor light-emitting element according to claim 1, wherein
the substrate is a sapphire substrate,
the semiconductor layer further includes
a relaxation layer positioned on the semiconductor sub-layer, the relaxation layer including at least one of In or Al, and
an active layer positioned on the relaxation layer, at least a portion of the active layer being a stacked structure of an InAlGaN layer and an AlGaN layer,
the semiconductor sub-layer is of an n-type, and
at least a portion of the semiconductor sub-layer is an AlGaN layer.

13. The semiconductor light-emitting element according to claim 12, wherein
the relaxation layer includes
an InAlGaN layer, or
a superlattice structure having an InAlGaN layer and an AlGaN layer provided alternately.

14. The semiconductor light-emitting element according to claim 13, wherein a width at half maximum of a (0002) plane in an X-ray diffraction measurement of the buffer layer is 350 arcsec or less.

15. The semiconductor light-emitting element according to claim 14, wherein the light emission peak wavelength is not less than 400 nm and not more than 420 nm.

16. The semiconductor light-emitting element according to claim 12, wherein the light emission peak wavelength is not less than 400 nm and not more than 420 nm.

* * * * *